(12) United States Patent
Huang et al.

(10) Patent No.: US 11,605,848 B2
(45) Date of Patent: Mar. 14, 2023

(54) TRACTION BATTERY SELF-HEATING CONTROL METHOD AND DEVICE

(71) Applicant: CONTEMPORARY AMPEREX TECHNOLOGY CO., LIMITED, Fujian (CN)

(72) Inventors: Xiaojian Huang, Fujian (CN); Zhimin Dan, Fujian (CN); Bao Li, Fujian (CN); Xiyang Zuo, Fujian (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 17/877,208

(22) Filed: Jul. 29, 2022

(65) Prior Publication Data
US 2022/0376320 A1 Nov. 24, 2022

Related U.S. Application Data

(63) Continuation of application No. PCT/CN2021/093844, filed on May 14, 2021.

(30) Foreign Application Priority Data

Jul. 10, 2020 (CN) .......................... 202010664362.6

(51) Int. Cl.
*H01M 10/63* (2014.01)
*H01M 10/615* (2014.01)
(Continued)

(52) U.S. Cl.
CPC .............. *H01M 10/63* (2015.04); *B60L 58/27* (2019.02); *G01K 3/005* (2013.01); *G01K 3/10* (2013.01);
(Continued)

(58) Field of Classification Search
CPC .. H01M 10/63; H01M 10/615; H01M 10/625; H01M 10/486; H01M 2220/20;
(Continued)

(56) References Cited

U.S. PATENT DOCUMENTS 8,983,746 B1 * 3/2015 Song ....................... F16D 48/06
701/68
9,893,672 B2 2/2018 Wesenberg et al.
(Continued)

FOREIGN PATENT DOCUMENTS

CN 105762434 A 7/2016
CN 110011586 A 7/2019
(Continued)

OTHER PUBLICATIONS

International Search Report dated Aug. 13, 2021 issued in PCT/CN2021/093844.
(Continued)

*Primary Examiner* — Zoheb S Imtiaz
(74) *Attorney, Agent, or Firm* — Scully Scott Murphy & Presser

(57) ABSTRACT

Disclosed is a traction battery self-heating control method and a device. Acquiring a second temperature of a rotor at a current sampling time according to system parameters and a first temperature of the rotor at a previous sampling time, and estimating a third temperature of the rotor at a next sampling time according to the first temperature and the second temperature, and stopping the self-heating of the traction battery when the third temperature reaches a demagnetization temperature of the rotor. Whether to stop the self-heating of the traction battery is determined by estimating a rotor temperature under the self-heating condition, and comparing the rotor temperature with the demagnetization temperature of the rotor, and thus the self-heating control of the traction battery is realized.

20 Claims, 5 Drawing Sheets

(51) Int. Cl.
H01M 10/625 (2014.01)
H01M 10/48 (2006.01)
H02P 29/66 (2016.01)
G01K 3/00 (2006.01)
G01K 3/10 (2006.01)
G01R 31/34 (2020.01)
B60L 58/27 (2019.01)

(52) U.S. Cl.
CPC ........ *G01R 31/343* (2013.01); *H01M 10/486* (2013.01); *H01M 10/615* (2015.04); *H01M 10/625* (2015.04); *H02P 29/662* (2016.11); *B60L 2240/425* (2013.01); *B60L 2240/545* (2013.01); *H01M 2220/20* (2013.01)

(58) Field of Classification Search
CPC .. H02P 29/662; B60L 58/27; B60L 2240/425; B60L 2240/545; G01K 3/005; G01K 3/10; G01R 31/343
See application file for complete search history.

(56) References Cited

U.S. PATENT DOCUMENTS

| | | | |
|---|---|---|---|
| 2009/0259419 A1* | 10/2009 | Kasai | B62D 5/0481 324/426 |
| 2009/0284202 A1 | 11/2009 | Miura | |
| 2012/0200241 A1* | 8/2012 | Kojima | B60L 58/25 318/139 |
| 2014/0350762 A1 | 11/2014 | Wesenberg et al. | |
| 2020/0153377 A1 | 5/2020 | Shin et al. | |
| 2022/0055603 A1* | 2/2022 | Lee | F04B 49/20 |
| 2022/0080858 A1 | 3/2022 | Lian et al. | |

FOREIGN PATENT DOCUMENTS

| | | |
|---|---|---|
| CN | 110071682 A | 7/2019 |
| CN | 110138312 A | 8/2019 |
| CN | 110323994 A | 10/2019 |
| CN | 111048856 A | 4/2020 |
| CN | 111162351 A | 5/2020 |
| JP | S50154912 A | 12/1975 |
| JP | H1127806 A | 1/1999 |
| JP | 4572907 B2 | 11/2010 |
| JP | 2019170004 A | 10/2019 |
| KR | 101394548 B1 | 5/2014 |
| WO | 2020125769 A1 | 6/2020 |

OTHER PUBLICATIONS

Written Opinion dated Aug. 13, 2021 issued in PCT/CN2021/093844.
Extended European Search Report dated Nov. 2, 2022 received in European Patent Application No. EP 21838030.1.
Notice of Reasons for Refusal dated Oct. 17, 2022 received in Japanese Patent Application No. JP 2021-571441.

\* cited by examiner

US 11,605,848 B2

TRACTION BATTERY SELF-HEATING CONTROL METHOD AND DEVICE

CROSS-REFERENCE TO RELATED APPLICATIONS

This application is a continuation of International Application No. PCT/CN2021/093844, filed on May 14, 2021, which claims priority to Chinese Patent Application No. 202010664362.6, filed on Jul. 10, 2020. The disclosures of the aforementioned applications are hereby incorporated by reference in their entireties.

TECHNICAL FIELD

The present application relates to the technical field of electric vehicles, in particular to a traction battery self-heating control method and device.

BACKGROUND

There are two methods to heat a vehicle-mounted traction battery pack of the electric vehicle: indirect heating and internal heating. The indirect heating method mainly includes air heating, liquid heating, phase change material heating, thermal resistance heating, etc. These heating methods usually heat the circulation container, and the heating efficiency is low by indirectly heating the heat conducting substance and conducting the heat to the battery pack. For the self-heating technology of internal heating, the self-heating technology adjusts the pulse current waveform that can heat the battery pack on the power architecture of the electric vehicle. Compared with the traditional battery pack heating solution, the self-heating technology has the characteristics of low cost and fast heating rate.

In the process of using a permanent magnet motor to heat the traction battery, it is necessary to obtain the rotor temperature for self-heating control. In the prior art, the rotor temperature is estimated under the normal operating condition of the motor. For motors in static or locked-rotor conditions, due to the change of motor motion state, the existing rotor temperature estimation methods are no longer applicable, and it is impossible to accurately estimate the self-heating duration of batteries.

SUMMARY

The present application provides a traction battery self-heating control method and device, aiming at accurately estimating the self-heating duration of the traction battery.

In a first aspect, the present application provides a traction battery self-heating control method, which includes: acquiring a second temperature of a rotor according to system parameters and a first temperature of a rotor of a permanent magnet motor; where the system parameters include a material specific heat capacity of the rotor, a mass of the rotor, and a power for heating the rotor in a sampling time interval, the first temperature is a temperature of the rotor at a first sampling time, the second temperature is a temperature of the rotor at a second sampling time, the second sampling time is a current sampling time, and the first sampling time is a previous sampling time of the second sampling time; estimating a third temperature of the rotor according to the first temperature and the second temperature, where the third temperature is a temperature of the rotor at a third sampling time, and the third sampling time is a next sampling time of the second sampling time; and stopping self-heating of the traction battery when the third temperature reaches a demagnetization temperature of the rotor.

Alternatively, the method further includes: collecting a cell temperature of a cell of the traction battery at the second sampling time; and stopping self-heating of the traction battery when the cell temperature reaches a specified temperature of the cell.

In the above technical solution, the cell temperature and a permanent magnet motor rotor temperature are monitored simultaneously.

Alternatively, acquiring the second temperature of the rotor based on the system parameters and the first temperature of the rotor specifically includes: determining a rotor temperature change amount in a sampling time interval according to the system parameters; and determining the second temperature according to the first temperature and the rotor temperature change amount.

Alternatively, determining the rotor temperature change amount in the sampling time interval according to the system parameters specifically includes: determining the rotor temperature change amount according to a first formula, where the first formula is:

$$\Delta T_R = \frac{\Delta P_1 \cdot \Delta \tau}{C_R M_R},$$

where $\Delta T_R$ denotes me rotor temperature change amount, $\Delta \tau$ denotes the sampling time interval, $C_R$ denotes the material specific heat capacity of the rotor, $M_R$ denotes the mass of the rotor, and $\Delta P_1$ denotes the power for heating the rotor.

Alternatively, estimating the third temperature of the rotor according to the first temperature and the second temperature, specifically includes: determining the rotor temperature change amount according to the first temperature and the second temperature; and estimating the third temperature according to the second temperature and the rotor temperature change amount.

In the above technical solution, the rotor temperature change amount in the sampling time interval is determined according to the system parameters. Then, the second temperature is determined according to the first temperature and the rotor temperature change amount, and then the third temperature of the rotor in the next sampling time can be further estimated, so as to realize the estimation of the rotor temperature under the self-heating working condition.

Alternatively, the method further includes: determining a heating power of the permanent magnet motor according to a loss and a heat dissipation power of the permanent magnet motor; acquiring a heating power of a stator core and a heating power of a stator winding of the permanent magnet motor; and determining the power for heating the rotor according to the heating power of the permanent magnet motor, the heating power of the stator winding and the heating power of the stator core.

Alternatively, before determining the heating power of the permanent magnet motor according to the loss and the heat dissipation power of the permanent magnet motor, the method further includes: calculating the loss of the permanent magnet motor according to a stator core loss, a stator winding loss and an eddy current loss of the rotor.

Alternatively, acquiring the heating power of the stator core and the heating power of the stator winding of the permanent magnet motor, specifically includes: acquiring a temperature change amount of the stator core and a temperature change amount of the stator winding in a sampling time interval are obtained; determining the heating power of the stator core according to the temperature change amount of the stator core, a mass of the stator core and a material specific heat capacity of the stator core; and determining the heating power of the stator winding according to a temperature change amount of the stator winding, a mass of the stator winding and a material specific heat capacity of the stator winding.

In the above technical solution, given that the rotor is in a resting state, by calculating stator winding loss, stator core loss and eddy current loss of rotor, the total loss of motor is obtained. Combined with the heat dissipation efficiency of the motor and the heating power of stator winding and stator core, the power used for rotor heating is determined, and then the rotor temperature can be further estimated based on the system parameters.

Alternatively, the method further includes: determining the eddy current loss of the rotor according to a second formula, where the second formula is: $P_R=K_r f^2 B_s^2$, where $P_R$ is the eddy current loss of the rotor, $K_r$ is an eddy current loss coefficient of the rotor, $B_s$ is a magnetic flux density amplitude of the rotor, and f denotes an electrification frequency of the stator winding.

In a second aspect, the present application provides a motor controller, which includes: an acquisition module, configured to acquire a second temperature of a rotor according to system parameters and a first temperature of a rotor of a permanent magnet motor; where the system parameters include: a material specific heat capacity of the rotor, a mass of the rotor, and a power for heating the rotor in a sampling time interval, the first temperature is a temperature of the rotor at a first sampling time, the second temperature is a temperature of the rotor at a second sampling time, the second sampling time is a current sampling time, and the first sampling time is a previous sampling time of the second sampling time; an estimation module, configured to estimate a third temperature of the rotor according to the first temperature and the second temperature, where the third temperature is a temperature of the rotor at a third sampling time, and the third sampling time is a next sampling time of the second sampling time; and a control module, configured to stop self-heating of the traction battery when the third temperature reaches a demagnetization temperature of the rotor.

Alternatively, the motor controller also includes a collecting module; the collecting module is configured to collect the cell temperature of the cell of the traction battery at the second sampling time; the control module is further configured to stop the self-heating of the traction battery when the cell temperature reaches a specified temperature of the cell.

Alternatively, the acquisition module is specifically configured to: determine a rotor temperature change amount in a sampling time interval according to the system parameters; and determine the second temperature according to the first temperature and the rotor temperature change amount.

Alternatively, the acquisition module is specifically configured to: determine the rotor temperature change amount according to a first formula, where the first formula is:

$$\Delta T_R = \frac{\Delta P_1 \cdot \Delta \tau}{C_R M_R},$$

where $\Delta T_R$ denotes the rotor temperature change amount, $\Delta \tau$ denotes the sampling time interval, $C_R$ denotes the material specific heat capacity of the rotor, $M_R$ denotes the mass of the rotor, and $\Delta P_1$ denotes the power for heating the rotor.

Alternatively, the estimation module is specifically configured to: determine the rotor temperature change amount according to the first temperature and the second temperature; and estimate the third temperature according to the second temperature and the rotor temperature change amount.

Alternatively, the acquisition module is further configured to: determine a heating power of the permanent magnet motor according to a loss and a heat dissipation power of the permanent magnet motor; acquire a heating power of a stator core and a heating power of a stator winding of the permanent magnet motor; and determine the power for heating the rotor according to the heating power of the permanent magnet motor, the heating power of the stator winding and the heating power of the stator core.

Alternatively, the acquisition module is further configured to: calculate the loss of the permanent magnet motor according to a stator core loss, a stator winding loss and an eddy current loss of the rotor.

Alternatively, the acquisition module is specifically configured to: acquire a temperature change amount of the stator core and a temperature change amount of the stator winding in a sampling time interval; determine the heating power of the stator core according to the temperature change amount of the stator core, a mass of the stator core and a material specific heat capacity of the stator core; and determine the heating power of the stator winding according to a temperature change amount of the stator winding, a mass of the stator winding and a material specific heat capacity of the stator winding.

Alternatively, the acquisition module is further configured to: determine the eddy current loss of the rotor according to a second formula, where the second formula is: $P_R=K_r f^2 B_s^2$, where $P_R$ is the eddy current loss of the rotor, $K_r$ is an eddy current loss coefficient of the rotor, $B_s$ is a magnetic flux density amplitude of the rotor, and f denotes an electrification frequency of the stator winding.

In a third aspect, the present application provides a power system, which includes: a permanent magnet motor, a traction battery, an inverter, and a motor controller, where the motor controller is used for executing the traction battery self-heating control method involved in the first aspect and the alternatives.

In a fourth aspect, the present application provides an electric vehicle including a power system, the power system includes: a permanent magnet motor, a traction battery, an inverter, and a motor controller, where the motor controller is used for executing the traction battery self-heating control method involved in the first aspect and the alternatives.

In a fifth aspect, the present application provides a control device, which includes: a memory, and a processor; the memory, is used for storing computer-executed instructions; where the processor is configured to execute the traction battery self-heating control method involved in the first aspect and the alternatives.

In a sixth aspect, the present application provides a computer-readable storage medium, in which computer-executed instructions are stored, and the computer-executed instructions, when executed by a processor, are used for realizing the traction battery self-heating control method involved in the first aspect and the alternatives.

The present application provides a traction battery self-heating control method and device, where a second temperature of a rotor at a current sampling time is acquired according to system parameters and a first temperature of the rotor at a previous sampling time, a third temperature of the rotor at a next sampling time is estimated according to the first temperature and the second temperature, and the self-heating of the traction battery is stopped when the third temperature reaches a demagnetization temperature of the rotor. In the present application, whether to stop the self-heating of the traction battery is determined by estimating a rotor temperature under the self-heating condition and comparing the rotor temperature with the demagnetization temperature of the rotor, and thus the self-heating control of the traction battery is realized.

BRIEF DESCRIPTION OF THE DRAWINGS

In order to more clearly explain the technical solution of the embodiments of the present application, the drawings required for use in the embodiments of the present application will be briefly described below, and it will be apparent that the drawings described below are only some embodiments of the present application, and other drawings may be obtained from the drawings without exerting creative effort by those of ordinary skill in the art.

Figure 1:
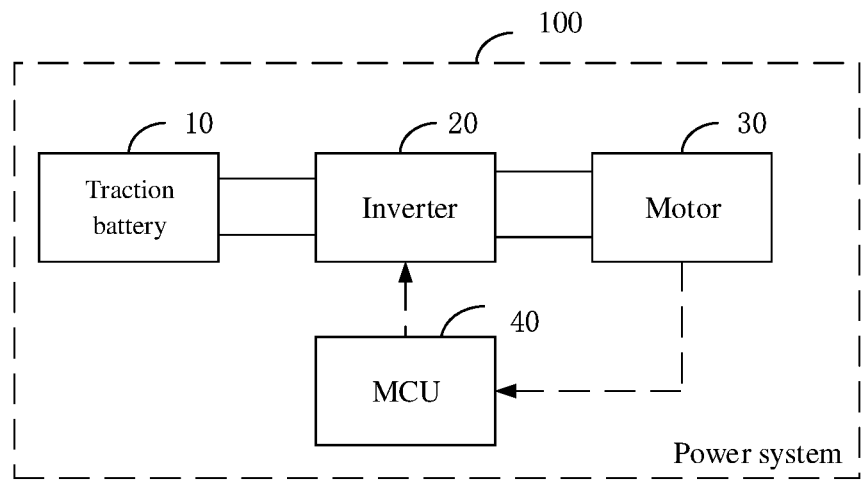
FIG. 1 is a structural schematic diagram of a power system disclosed by an embodiment of the present application.

In the drawings, the drawings are not drawn to actual scale.

DESCRIPTION OF EMBODIMENTS

Implementations of the present application are described in further detail below in conjunction with the accompanying drawings and embodiments. The following detailed description of the embodiments and the accompanying drawings are used to illustrate the principles of the present application, but are not intended to limit the scope of the present application, i.e., the present application is not limited to the described embodiments.

In the description of this application, it should be noted that, unless otherwise indicated, "a plurality of" means more than two; the terms "up", "down", "left", "right", "inside", "outside" and the like indicate orientations or positional relationships for ease of description and simplification of the description only, and are not intended to indicate or imply that the device or element in question must have a particular orientation, be constructed and operated in a particular orientation and therefore cannot be construed as limiting to the present application. Furthermore, the terms "first", "second", "third", etc. are used for descriptive purposes only and cannot be understood to indicate or imply relative importance. "Vertical" is not vertical in the strict sense, but within the allowable range of errors. "Parallel" is not parallel in the strict sense, but within the allowable range of errors.

The locative words appearing in the following description are all directions shown in the figure and are not intended to limit the specific structure of the present application. In the description of this application, it should also be noted that unless expressly specified and defined otherwise, the terms "mounted", "linked" and "connected" are understood in a broad sense, for example, it can be a fixed connection or a detachable connection, or being integrally connected; it can be being directly connected or connected through an intermediate medium. The specific meanings of the above terms in the present application will be understood by those of ordinary skill in the art depending on specific circumstances.

Electric vehicles refer to vehicles powered by power batteries. As shown in FIG. 1, a power system 100 of an electric vehicle includes a traction battery 10, an inverter 20, a motor 30 and a Motor Controller Unit (MCU) 40. Positive and negative electrodes of the traction battery 10 are connected to a DC side of the inverter 20, and an AC side of the inverter 20 is connected to a stator winding of the motor 30. The traction battery 10 supplies power to the motor through the inverter 20. The MCU 40 is provided with a plurality of input ends for receiving motor operation status data and a motor control instruction. The MCU 40 generates a Pulse Width Modulation (PWM) signal according to the motor control instruction, the motor operation status data and traction battery operation status data, and controls magnitudes of voltage and current supplied to the motor 30 by the inverter, to control a motor speed, so as to realize the vehicle running speed control.

Figure 2:
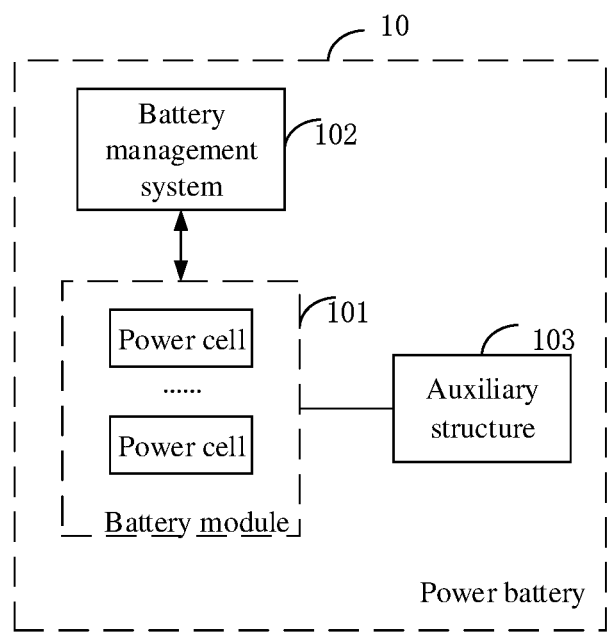
FIG. 2 is a structural schematic diagram of a traction battery disclosed in an embodiment of the present application.

As shown in FIG. 2, the traction battery 10 includes a battery module 101, a Battery Management System (BMS) 102 and an auxiliary structure 103. The battery module 101 is formed by a plurality of power cells in series and parallel connection, and the power cells are the core components of the traction battery and the source of electric energy provided by the traction battery. The main functions of the battery management system 102 are charge and discharge management, high voltage control, battery status evaluation, battery data collection, battery protection, and battery thermal management. The auxiliary structure 103 generally includes an external frame, an electrical connection means, an insulating member and the like. The external frame plays a role in protecting and supporting the battery module, and the electrical connection means plays a role in connecting other electrical equipment, such as connecting with the inverter, and the insulating member plays a role in insulation protection.

The thermal management function in the battery management system 102 is used to ensure that the traction battery works within an appropriate temperature range. The thermal management function is mainly to achieve accurate measurement and monitoring of battery temperature, implement effective heat dissipation when the battery temperature is too high and rapid heating at low temperature conditions, and ensure the uniform distribution of battery temperature field. Rapid heating at low temperature conditions means that when it is used in areas with low cell temperature, it is necessary to heat the traction battery to the rated cell temperature, so that the traction battery can play its best performance stably.

The existing heating methods of power batteries can be divided into indirect heating and direct heating. Indirect heating refers to placing a heat source outside the traction battery for heating. Indirect heating method can be air heating, liquid heating, heating film heating and so on. The heating rate of the battery will be different with different heating sources. Since the battery is heated by an external heat source, heat loss will occur in the heat transfer medium, so the efficiency of indirect heating is not high.

Direct heating refers to heating the traction battery internally. The common direct heating method is heating through internal resistance, in particular is to input a PWM signal to a control end of the inverter to keep the motor static. The traction battery and stator winding form a closed loop and the stator winding stores electric energy. Due to the inductance characteristics of the stator winding, the stator winding provides alternating current to the battery, and the traction battery is heated in a way that the alternating current flows through its internal resistance. Since the internal resistance of the traction battery is large in low temperature environment, the heating efficiency of the traction battery is high.

Self-heating technology of the traction battery is widely used in electric vehicles for its high heating efficiency. When battery self-heating technology is applied to permanent magnet synchronous motor, in the self-heating of traction battery, since the rotor is kept in a resting state, a large amount of eddy current will be induced in the rotor, and the eddy current loss will cause the rotor temperature to rise. When the temperature of the permanent magnet of the rotor exceeds a critical temperature, the permanent magnet of the rotor will be irreversibly demagnetized, which will affect the normal use of the motor. Therefore, when self-heating the traction battery, it is necessary to monitor the rotor temperature in real time.

At present, the rotor temperature is estimated under the normal operating condition of the motor. For motors in static or locked-rotor conditions, due to the change of motor motion state, the existing rotor temperature estimation methods are no longer applicable.

The present application provides a traction battery self-heating control method and device, aiming at solving the above problems. The inventive concept of the present application is: the applicant discovered that due to the self-heating condition, the rotor of the permanent magnet motor is in a resting state, the stator winding, as an energy storage element, provides alternating current. Therefore, when estimating rotor temperature, a sum of a stator core loss, a rotor loss and a stator winding loss is taken as motor loss, and then rotor heating power is calculated according to the motor loss, motor heat dissipation, a heating power of the stator winding and a heating power of the stator core, and then the rotor temperature is estimated according to the rotor heating power. Whether to stop the self-heating of the traction battery is determined by estimating the rotor temperature when the rotor is in the resting state and comparing the rotor temperature with the demagnetization temperature of the rotor, and thus the self-heating control of the traction battery is realized.

Figure 3:
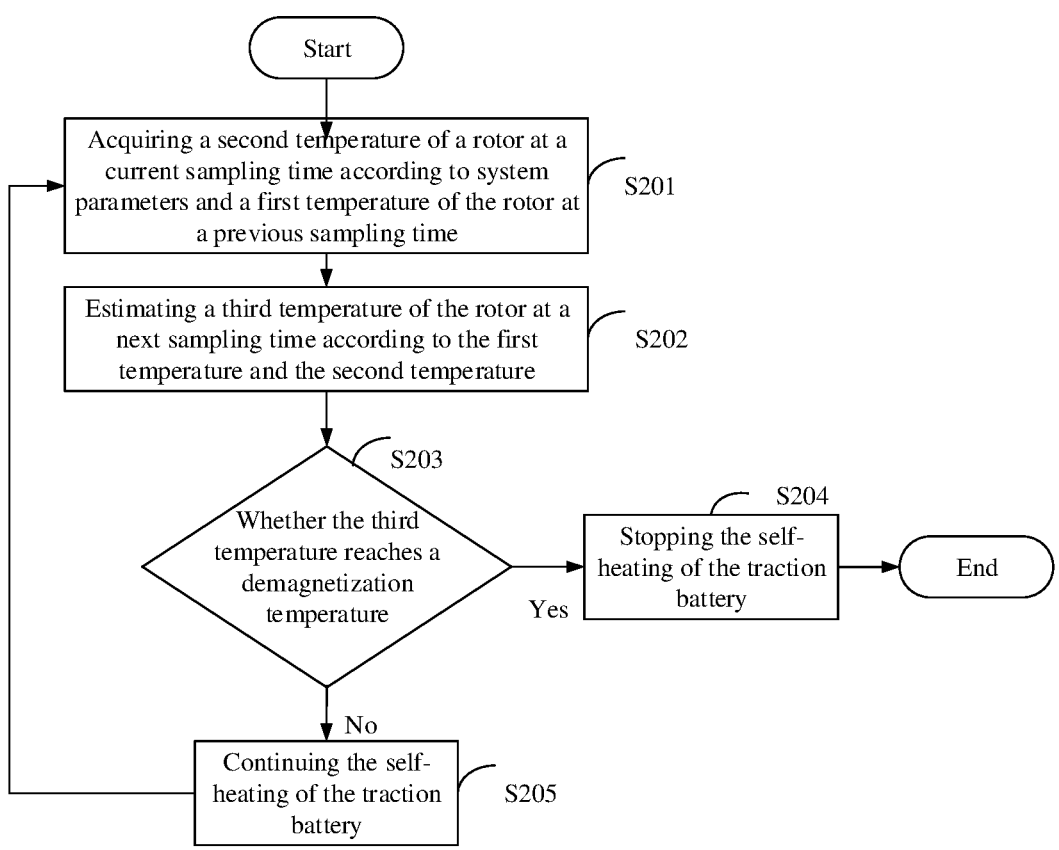
FIG. 3 is a flow diagram of a traction battery self-heating control method disclosed in an embodiment of the application.

As shown in FIG. 3, Embodiment 1 of the present application provides a traction battery self-heating control method, an executive body of the method is an MCU, and the method includes the following steps:

S201, acquiring a second temperature of a rotor according to system parameters and a first temperature of a rotor of a permanent magnet motor.

The system parameters include a material specific heat capacity of the rotor, a mass of the rotor and a power for heating the rotor in a sampling time interval.

The first temperature is a temperature of the rotor at a first sampling time, and the second temperature is a temperature of the rotor at a second sampling time. The second sampling time is a current sampling time, and the first sampling time is a previous sampling time of the second sampling time.

S202, estimating a third temperature of the rotor according to the first temperature and the second temperature.

The third temperature is a temperature of the rotor at a third sampling time, and the third sampling time is a next sampling time of the second sampling time.

S203, judging whether the third temperature reaches a demagnetization temperature of the rotor, if yes, proceeding to S204, otherwise, proceeding to S205.

S204, stopping the self-heating of the traction battery.

The MCU generates a motor control instruction to stop heating, and stops heating the traction battery by controlling the inverter.

S205. continuing the self-heating of the traction battery.

The MCU generates the motor control instruction to continue heating, and makes the permanent magnet motor continue to heat the traction battery by controlling the inverter.

In the control method provided by the embodiment of the application, the rotor temperature under the self-heating condition is first estimated, and then the rotor temperature is compared with the demagnetization temperature of the rotor to determine whether to stop the self-heating of the traction battery, so as to realize the control of the self-heating process of the traction battery.

Figure 4:
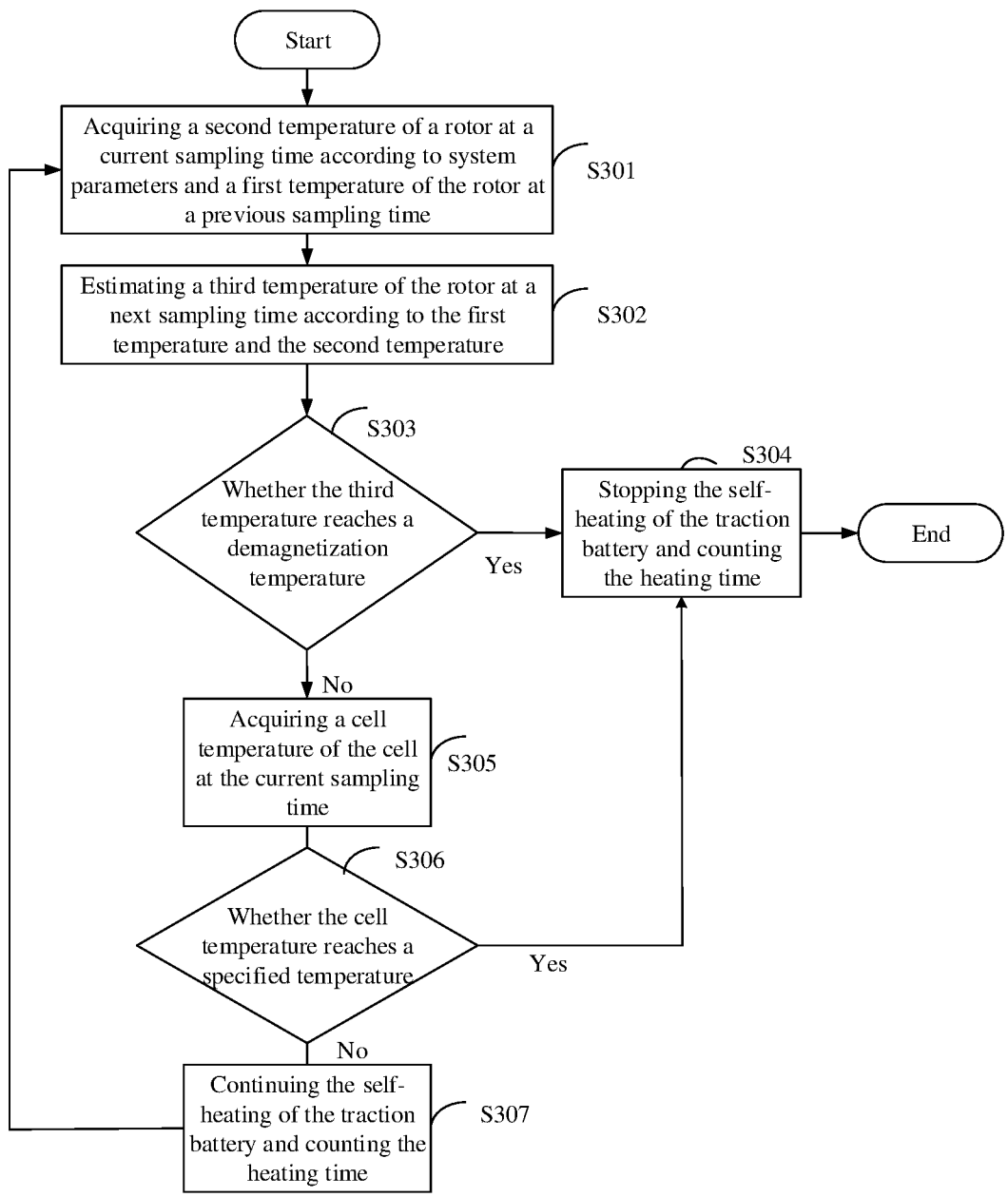
FIG. 4 is a flow diagram of a traction battery self-heating control method disclosed in another embodiment of the present application.

As shown in FIG. 4, Embodiment 2 of the present application provides a traction battery self-heating control method, an executive body of the method is an MCU, and the method includes the following steps:

S301, acquiring a second temperature of a rotor according to system parameters and a first temperature of a rotor of a permanent magnet motor.

The second temperature of the rotor is acquired by determining a rotor temperature change amount in a sampling time interval according to system parameters. A second temperature is determined according to the first temperature and the rotor temperature change amount.

The rotor temperature change amount is determined according to a first formula, where, the first formula is:

$$\Delta T_R = \frac{\Delta P_1 \cdot \Delta \tau}{C_R M_R} \qquad (1)$$

where $\Delta T_R$ denotes the rotor temperature change amount, $\Delta \tau$ denotes the sampling time interval, $C_R$ denotes the material specific heat capacity of the rotor, $M_R$ denotes the mass of the rotor, and $\Delta P_1$ denotes the power for heating the rotor.

After determining the rotor temperature change amount, the first temperature and the rotor temperature change amount are superimposed to obtain the second temperature. The rotor temperature change amount in the sampling time interval is obtained according to the system parameters, and the rotor temperature in the current sampling time is obtained according to the rotor temperature in the previous sampling time and the calculated rotor temperature change amount, so as to realize the rotor temperature estimation under the self-heating working condition.

S302, estimating a third temperature of the rotor according to the first temperature and the second temperature.

The third temperature of the rotor is estimated by determining the rotor temperature change amount according to the first temperature and the second temperature, and estimating the third temperature according to the second temperature and the rotor temperature change amount.

The second temperature is subtracted from the first temperature to determine the rotor temperature change amount over a sampling time interval. Then, the second temperature of the rotor at the current sampling time and the rotor temperature change amount in the sampling time interval are superimposed to determine the third temperature of the rotor at the next sampling time.

When the first temperature represents a temperature of the rotor at an initial sampling time, an ambient temperature of the rotor is used as the temperature of the initial sampling time.

S303, judging whether the third temperature reaches a demagnetization temperature of the rotor, if yes, proceeding to S304, otherwise, proceeding to S305.

S304, stopping the self-heating of the traction battery.

S305, collecting a cell temperature of a cell of the traction battery at the second sampling time.

The cell temperature of the cell of the traction battery at the second sampling time is collected by a sensor arranged inside the traction battery.

It should be noted that S305 and S306 are not limited to being placed after the step S304, that is, the steps of collecting the cell temperature, and judging the cell temperature are not limited to following the step of judging whether the rotor temperature reaches the demagnetization temperature, but may also be executed before any one of the steps S301 to S304.

S306, judging whether the cell temperature reaches a specified temperature of the cell, if yes, proceeding to S304, otherwise, proceeding to S307.

The specified temperature of the cell is determined according to the cell material. When the cell temperature of the traction battery reaches the specified temperature, the traction battery can achieve the best performance. Whether to stop the self-heating of the traction battery is determined according to the cell temperature, and the self-heating is stopped when the cell temperature reaches the specified temperature of the cell, and thus realizing the control of the self-heating process of the traction battery.

S307, continuing the self-heating of the traction battery and turning to S301.

In the control method provided by the embodiment of the present application, the rotor temperature change amount in the sampling time interval is determined according to the system parameters. A second temperature is then determined according to the first temperature and the rotor temperature change amount. Furthermore, the third temperature of the rotor in the next sampling time can be further estimated. After the rotor temperature under the self-heating condition is estimated, whether to stop the self-heating of the traction battery is determined according to the rotor temperature and the rotor demagnetization temperature, and the self-heating control of the traction battery is realized.

Figure 5:
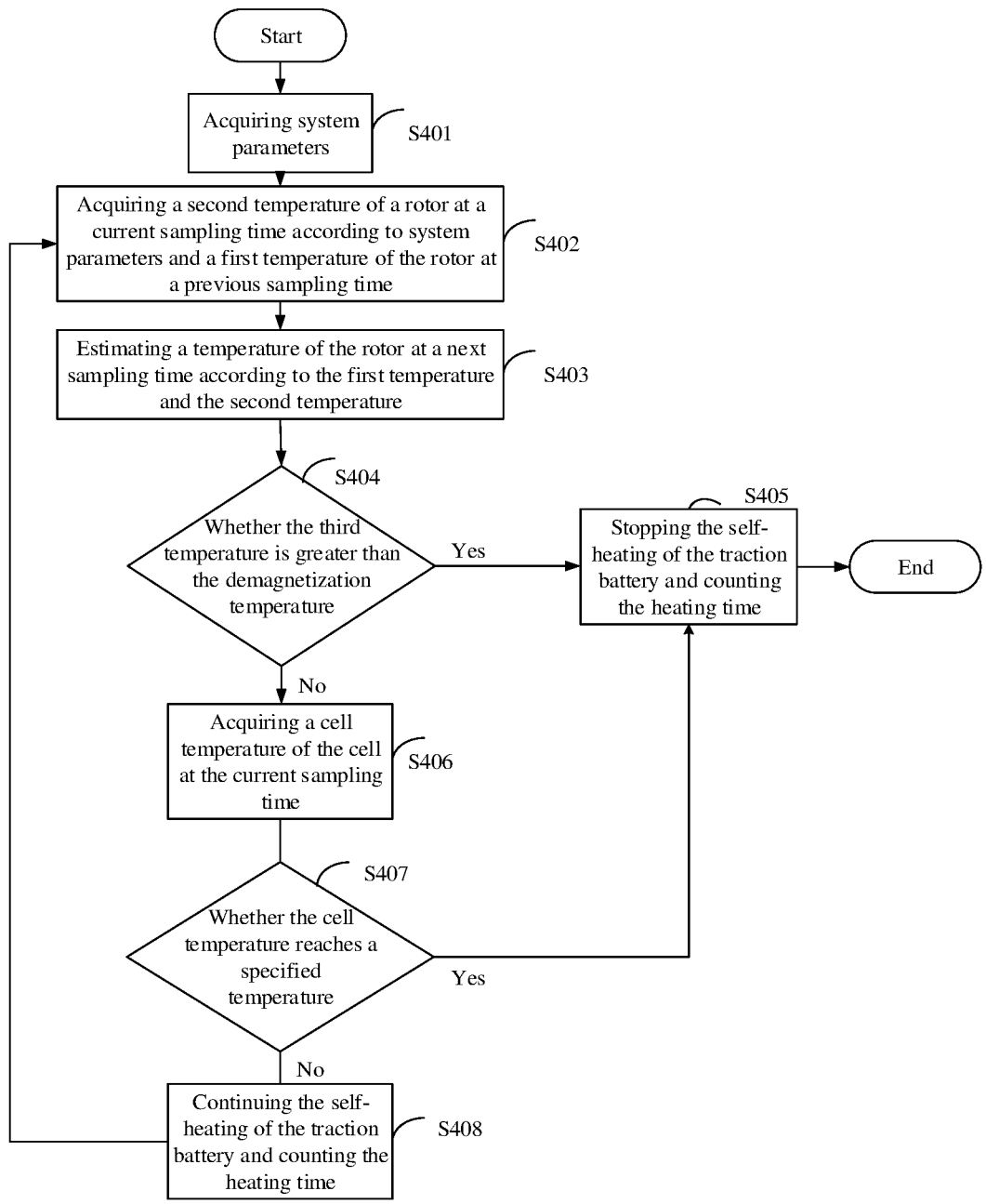
FIG. 5 is a principle diagram of a traction battery self-heating control method disclosed in an embodiment of the present application.

Below in conjunction with FIG. 5 will illustrate a traction battery self-heating control method provided by Embodiment 3 of the present application, an executive body of the method is an MCU, and the method includes the following steps:

S401. acquiring system parameters of a permanent magnet motor.

The system parameters include a material specific heat capacity of the rotor, a mass of the rotor and a power for heating the rotor in a sampling time interval.

An eddy current loss $P_R$ of the rotor is determined according to a second formula, where the second formula is:

$$P_R = K_r f^2 B_s^2 \qquad (2)$$

where $P_R$ is the eddy current loss of the rotor, $K_r$ is an eddy current loss coefficient of the rotor, $B_s$ is a magnetic flux density amplitude of the rotor, and f denotes an electrification frequency of the stator winding.

The power $\Delta P_1$ for heating the rotor in the sampling time interval is obtained by: determining a heating power of the permanent magnet motor according to a loss and a heat dissipation power $P_i$ of the permanent magnet motor; acquiring a heating power of a stator core and a heating power of a stator winding of the permanent magnet motor; and determining the power $\Delta P_1$ for heating the rotor according to the heating power of the permanent magnet motor, the heating power of the stator winding and the heating power of the stator core.

The loss of permanent magnet motor is calculated by: calculating the loss of the permanent magnet motor according to a stator core loss $P_{Fe}$, a stator winding loss $P_{Cu}$ and an eddy current loss of the rotor $P_R$.

The stator core loss is calculated according to the following formula (3):

$$P_{Fe} = k_h f B_m^2 + k_e f^2 B_m^2 + k_c f^{1.5} B_m^{1.5} \qquad (3)$$

where $k_h$, $k_e$, $k_c$ are hysteresis loss coefficient, eddy current loss coefficient and additional loss coefficient of the stator core, respectively, which can be obtained by testing and fitting. f is the electrification frequency of the stator winding, and $B_m$ is the amplitude of magnetic flux density of the stator core.

The stator winding loss $P_{Cu}$ is calculated according to the following formula (4):

$$P_{Cu} = I_A^2 R_A + I_B^2 R_B + I_C^2 R_{BC} \qquad (4)$$

where $I_A$, $I_B$, $I_C$ denotes a current amplitude in a three-phase stator winding of the permanent magnet motor, and $R_A$, $R_B$, $R_C$ denotes resistances of Phase A, Phase B and Phase C of the stator winding. The current $I_A$, $I_B$, $I_c$ in the stator winding can be obtained by MCU sampling.

According to formulae (2) to (4), the rotor eddy current loss $P_R$, stator core loss $P_{Fe}$ and stator winding loss $P_{Cu}$ are calculated respectively, and then the stator core loss $P_R$, stator winding loss $P_{Fe}$ and rotor eddy current loss $P_{Cu}$ are superimposed to obtain the permanent magnet motor loss.

The heat dissipation power $P_i$ of the permanent magnet motor is calculated according to the cooling structure of the motor. When the permanent magnet motor adopts water cooling, the heat dissipation power $P_i$ can be calculated according to the following formula (5):

$$P_i = \alpha * L * A * \Delta T \qquad (5)$$

where α denotes a heat dissipation coefficient of the motor, L and A respectively denote length and width of the cooling water channel, and ΔT denotes a temperature difference between the water inlet and the water outlet.

It should be noted that different cooling structures correspond to different heat dissipation models, and the corresponding heat dissipation will also change.

After obtaining the loss and the heat dissipation power $P_i$ of the permanent magnet motor, the heating power ΔP of the permanent magnet motor can be obtained by subtracting the loss and the heat dissipation power $P_i$ of the permanent magnet motor.

The heating power of the stator core and the heating power of the stator winding of the permanent magnet motor by: acquiring a temperature change amount of the stator core and a temperature change amount of the stator winding in a sampling time interval are obtained; determining the heating power of the stator core $\Delta P_2$ according to the temperature change amount of the stator core, a mass of the stator core $M_S$ and a material specific heat capacity of the stator core $C_S$; and determining the heating power of the stator winding $\Delta P_3$ according to a temperature change amount of the stator winding, a mass of the stator winding $M_{Cu}$ and a material specific heat capacity of the stator winding $C_{Cu}$.

The heating power of the stator core is calculated according to the following formula:

$$\Delta P_2 = \frac{C_S M_S (T_{S2} - T_{S1})}{\Delta t} \quad (6)$$

where $\Delta P_2$ denotes the heating power of the stator core, $C_S$ denotes the martial specific heat capacity of the stator core, $M_S$ denotes the mass of the stator core, $T_{S2}$ denotes the temperature of the stator core at the current sampling time, $T_{S1}$ denotes the temperature of the stator core at the previous sampling time, and $\Delta t$ denotes the sampling time interval, the temperature of the stator core can be obtained by a temperature sensor arranged on the stator.

The heating power of stator winding is calculated according to the following formula:

$$\Delta P_3 = \frac{C_{Cu} M_{Cu} (T_{Cu2} - T_{Cu1})}{\Delta t} \quad (7)$$

where $\Delta P_3$ denotes the temperature of the stator winding, $C_{Cu}$ denotes the martial specific heat capacity of the stator winding, $M_{Cu}$ denotes the mass of the stator winding, $T_{Cu2}$ denotes the temperature of the stator winding at the current sampling time, $T_{Cu1}$ denotes the temperature of the stator winding at the previous sampling time, and the temperature of the stator winding can be obtained by a temperature sensor arranged on the stator winding.

After obtaining the heating power of the permanent magnet motor, the heating power of the stator winding and the heating power of the stator core, the heating power $\Delta P_i$ of permanent magnet motor is subtracted from the heating power of stator winding and subtracted from the heating power of stator core, so as to obtain the heating power of rotor.

The power for heating the rotor can be calculated according to the following formula (8):

$$\begin{aligned}\Delta P_1 &= \Delta P - (\Delta P_2 + \Delta P_3) \\ &= (P_{Fe} + P_{Cu} + P_R - P_i) - (\Delta P_2 + \Delta P_3)\end{aligned} \quad (8)$$

where $\Delta P$ denotes the heating power of the motor.

In the above solution, the motor heating power is determined according to the motor loss and the motor heat dissipation power, and then the rotor heating power is calculated according to the motor heating power, the stator core heating power and the stator winding heating power, and then the rotor temperature can be further estimated according to the rotor heating power.

S402, acquiring a second temperature of a rotor according to system parameters and a first temperature of a rotor of a permanent magnet motor.

After the rotor temperature change amount $\Delta T_R$ is calculated according to formula (1), the second temperature is calculated according to the following formula:

$$T_{Ri} = \Delta T_R + T_{Ri-1} \quad (9)$$

where $T_{Ri}$ denotes the temperature of the rotor at the current sampling time, and $T_{Ri-1}$ denotes the temperature of the rotor at the previous sampling time.

S403, estimating a third temperature of the rotor according to the first temperature and the second temperature.

After the second temperature is calculated according to formula (9), a current heating rate $\upsilon$ of the rotor is calculated, and the specific calculation formula (10) is as follows:

$$\upsilon = \frac{T_{Ri} - T_{Ri-1}}{\Delta t} \quad (10)$$

According to the current rotor heating rate, the rotor temperature $T_{Ri+1}$ at the next sampling time is estimated, and its calculation formula (11) is as follows:

$$T_{Ri+1} = \upsilon * \upsilon t + T_{Ri} \quad (11)$$

where $T_{Ri+1}$ denotes a rotor temperature at the next sampling time.

Since the sampling time intervals of the MCU are the same, formulae (10) and (11) can be simplified to the following formula (12):

$$T_{Ri+1} = 2T_{Ri} - T_{Ri-1} \quad (12)$$

S404, judging whether the third temperature reaches a demagnetization temperature of the rotor, if yes, proceeding to S405, otherwise, proceeding to S406.

S405, stopping the self-heating of the traction battery.

S406, collecting a cell temperature of a cell of the traction battery at the second sampling time.

S407, judging whether the cell temperature reaches a specified temperature of the cell, if yes, proceeding to S405, otherwise, proceeding to S408.

S408, continuing the self-heating of the traction battery and turning to S401.

In the control method provided by the embodiment of the present application, given that the rotor is in a resting state, by calculating the stator winding loss, stator core loss and rotor eddy current loss, and then obtaining the total loss of the motor, subtracting the heat dissipation efficiency of the motor, the total heating power of the motor can be determined; and by subtracting the heating power of stator winding and the heating power of the stator core from the total heating power, the power for heating the rotor can be determined, then, the rotor temperature can be further estimated based on the system parameters, and the rotor temperature under the self-heating working condition can be estimated by the above method. The rotor temperature is compared with the rotor demagnetization temperature, to determine whether to stop the self-heating of the traction battery according to the comparison result, thus realizing the control of the self-heating process of the traction battery.

Embodiment 4 of the present application is described below to provide a traction battery self-heating control method, where an executive body of the method is an MCU, and the method includes the following steps:

S501. acquiring system parameters of a permanent magnet motor.

A current in the stator winding is collected by a current sensor arranged on the stator winding, a stator winding temperature $T_{Cu}$ and a stator core temperature $T_s$ are collected by a temperature sensor arranged on the stator winding and the stator core, and an ambient temperature is collected by a temperature sensor arranged in the environment.

The data collected by each sensor are collected by the motor controller unit MCU, to obtain a stator winding current amplitude $I_1$ of the permanent magnet motor, a frequency f of the current supplied to the stator winding, the stator winding temperature $T_{Cu}$ of the permanent motor, the motor stator core temperature $T_s$ of the permanent motor and the ambient temperature $T_0$, and the ambient temperature is used as the initial temperature of the rotor at the initial sampling time.

Through simulation and experimental benchmarking, the flux density correspondence table of stator flux density $B_m$ and rotor flux density $B_s$ corresponding to the stator winding supplied with different currents is established.

Change amounts of the temperature of the stator core and the temperature of the stator winding are measured by the temperature sensors on the surface of the stator core and the end portion of the stator winding, and then the heating power of the stator winding and the heating power of the stator core are calculated.

The current and frequency of stator winding are measured by a current sensor, and the stator winding loss is calculated. The stator flux density and rotor flux density corresponding to heating current are determined by searching the flux density correspondence table, and the stator core loss and rotor eddy current loss are calculated.

After collecting the data of each sensor, MCU determines the stator magnetic flux density $B_m$ according to the current supplied to the stator winding, and then calculates the power for heating rotor heating in the sampling time interval according to formulae (1) to (8). MCU also needs to load the material specific heat capacity of the rotor and the mass of the rotor.

S502, acquiring a second temperature of a rotor according to system parameters and a first temperature of a rotor of a permanent magnet motor.

A second temperature of the rotor at the current sampling time is calculated by formula (9).

S503, estimating a third temperature of the rotor according to the first temperature and the second temperature.

The temperature of the rotor at a next sampling time is predicted by formula (12).

S504, judging whether the third temperature reaches a demagnetization temperature of the rotor, if yes, proceeding to S505, otherwise, proceeding to S506.

S505, stopping the self-heating of the traction battery and counting the heating time.

When the estimated rotor temperature reaches the demagnetization temperature of the rotor, the heating of the traction battery is stopped, and the heating time of the traction battery is counted, and the method ends.

S506, collecting a cell temperature of a cell of the traction battery at the second sampling time.

The temperature sensor arranged in the traction battery collects the temperature of the cell, and the BMS collects the temperature of the cell obtained by the temperature sensor, through the communication between MCU and BMS, the BMS transmits the temperature of the cell to the motor controller unit MCU.

S507, judging whether the cell temperature reaches a specified temperature of the cell, if yes, proceeding to S505, otherwise, proceeding to S508.

S508, continuing the self-heating of the traction battery and turning to S501.

In the control method provided by the embodiment of the present application, data are collected by sensors arranged in the stator and the environment, based on the above data, the system parameters are determined, and then the rotor temperature is estimated according to the above system parameters. After obtaining the rotor temperature under the self-heating condition, the rotor temperature is compared with the rotor demagnetization temperature to determine whether to stop the self-heating of the traction battery and realize the control of the self-heating process of the traction battery.

Figure 6:
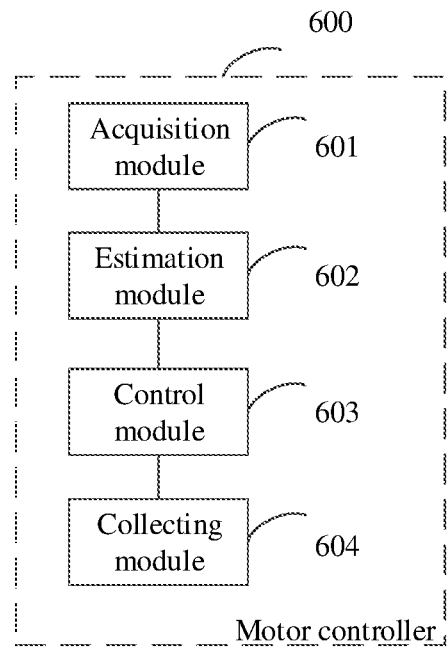
FIG. 6 is a structure principle diagram of a motor controller disclosed in an embodiment of the present application.

As shown in FIG. 6, the present application provides a motor controller for executing various steps in the self-heating control method of the permanent magnet motor of the above embodiment, the motor controller 600 includes: an acquisition module 601 for acquiring a second temperature of a rotor according to system parameters and a first temperature of a rotor of a permanent magnet motor, where the system parameters include a material specific heat capacity of the rotor, a mass of the rotor, and a power for heating the rotor in a sampling time interval, the first temperature is a temperature of the rotor at a first sampling time, the second temperature is a temperature of the rotor at a second sampling time, the second sampling time is a current sampling time, and the first sampling time is a previous sampling time of the second sampling time; an estimation module 602 for estimating a third temperature of the rotor according to the first temperature and the second temperature, where the third temperature is a temperature of the rotor at a third sampling time, and the third sampling time is a next sampling time of the second sampling time; and a control module 603 for stopping self-heating of the traction battery when the third temperature reaches a demagnetization temperature of the rotor.

Alternatively, the motor controller also includes a collecting module 604; the collecting module 604 is used for collecting the cell temperature of the cell of the traction battery at the second sampling time; the control module 603 is also used for stopping the self-heating of the traction battery when the cell temperature reaches a specified temperature of the cell.

Alternatively, the acquisition module 601 is specifically used for: determining a rotor temperature change amount in a sampling time interval according to the system parameters; and determining the second temperature according to the first temperature and the rotor temperature change amount.

Alternatively, the acquisition module 601 is specifically used for: determining the rotor temperature change amount according to a first formula, where the first formula is: $\Delta T_R = \Delta P_1 \cdot \Delta \tau / C_R M_R$, where $\Delta T_R$ denotes the rotor temperature change amount, $\Delta \tau$ denotes the sampling time interval, $C_R$ denotes the material specific heat capacity of the rotor, $M_R$ denotes the mass of the rotor, and $\Delta P_1$ denotes the power for heating the rotor.

Alternatively, the estimation module 602 is specifically used for: determining the rotor temperature change amount according to the first temperature and the second temperature; and estimating the third temperature according to the second temperature and the rotor temperature change amount.

Alternatively, the acquisition module 601 is also used for: determining a heating power of the permanent magnet motor according to a loss and a heat dissipation power of the permanent magnet motor; acquiring a heating power of a stator winding and a heating power of a stator winding of the permanent magnet motor; and determining the power for heating the rotor according to the heating power of the permanent magnet motor, the heating power of the stator winding and the heating power of the stator core.

Alternatively, the acquisition module 601 is also used for: calculating the loss of the permanent magnet motor according to a stator core loss, a stator winding loss and an eddy current loss of the rotor.

Alternatively, the acquisition module 601 is specifically used for: acquiring a temperature change amount of the stator core and a temperature change amount of the stator winding in a sampling time interval are obtained; determining the heating power of the stator core according to the temperature change amount of the stator core, a mass of the stator core and a material specific heat capacity of the stator core; and determining the heating power of the stator winding according to a temperature change amount of the stator winding, a mass of the stator winding and a material specific heat capacity of the stator winding.

Alternatively, the acquisition module 601 is further used for: determining the eddy current loss of the rotor according to a second formula, where the second formula is: $P_R = K_r f^2 B_s^2$, where $P_R$ is the eddy current loss of the rotor, $K_r$ is an eddy current loss coefficient of the rotor, $B_s$ is a magnetic flux density amplitude of the rotor, and f denotes an electrification frequency of the stator winding.

Figure 7:
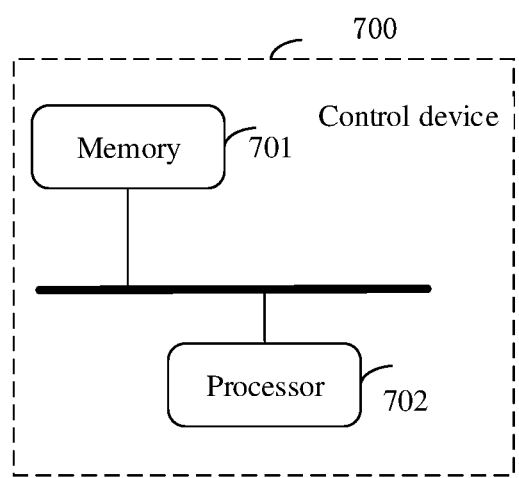
FIG. 7 is a structure principle diagram of a control device disclosed in an embodiment of the present application.

As shown in FIG. 7, a control device 700 provided in the embodiment includes a memory 701 and a processor 702.

The memory 701, is used for storing computer-executed instructions; the processor 702, is used for executing computer-executed instructions stored in the memory, to implement the steps executed by the self-heating control method of the permanent magnet motor in the above-described embodiments. For the details, please refer to the related description in the aforementioned embodiments of the permanent magnet motor self-heating control method.

Alternatively, the memory 701 may be either independent or integrated with the processor 702.

The control device also includes a bus for connecting the memory 701 and the processor 702 when the memory 701 is independently disposed.

The embodiments of the application also provide a computer-readable storage medium in which the computer-executed instruction is stored. When the processor executes the computer-executed instruction, the self-heating control method of the permanent magnet motor executed by the above control device is realized.

Although the present application has been described with reference to better embodiments various modifications may be made thereto and components therein may be replaced with equivalents without departing from the scope of the present application. In particular, the various technical features mentioned in the various embodiments may be combined in any manner so long as there is no structural conflict. The present application is not limited to the specific embodiments disclosed herein but includes all technical solutions falling within the scope of the claims.

What is claimed is:

1. A traction battery self-heating control method, comprising:
acquiring a second temperature of a rotor according to system parameters and a first temperature of a rotor of a permanent magnet motor; wherein the system parameters comprise: a material specific heat capacity of the rotor, a mass of the rotor and a power for heating the rotor in a sampling time interval, the first temperature is a temperature of the rotor at a first sampling time, the second temperature is a temperature of the rotor at a second sampling time, the second sampling time is a current sampling time, and the first sampling time is a previous sampling time of the second sampling time;
estimating a third temperature of the rotor according to the first temperature and the second temperature, wherein the third temperature is a temperature of the rotor at a third sampling time, and the third sampling time is a next sampling time of the second sampling time; and
stopping self-heating of the traction battery when the third temperature reaches a demagnetization temperature of the rotor.

2. The method according to claim 1, wherein the method further comprises:
collecting a cell temperature of a cell of the traction battery at the second sampling time; and
stopping the self-heating of the traction battery when the cell temperature reaches a specified temperature of the cell.

3. The method according to claim 2, wherein estimating the third temperature of the rotor according to the first temperature and the second temperature, specifically comprises:
determining a rotor temperature change amount according to the first temperature and the second temperature; and
estimating the third temperature according to the second temperature and the rotor temperature change amount.

4. The method according to claim 1, wherein acquiring the second temperature of the rotor according to the system parameters and the first temperature of the rotor, specifically comprises:
determining a rotor temperature change amount in the sampling time interval according to the system parameters; and
determining the second temperature according to the first temperature and the rotor temperature change amount.

5. The method according to claim 4, wherein determining the rotor temperature change amount in the sampling time interval according to the system parameters, specifically comprises:
determining the rotor temperature change amount according to a first formula, wherein the first formula is:

$$\Delta T_R = \frac{\Delta P_1 \cdot \Delta \tau}{C_R M_R}$$

wherein $\Delta T_R$ denotes the rotor temperature change amount, $\Delta \tau$ denotes the sampling time interval, $C_R$ denotes the material specific heat capacity of the rotor, $M_R$ denotes the mass of the rotor, and $\Delta P_1$ denotes the power for heating the rotor.

6. The method according to claim 1, wherein estimating the third temperature of the rotor according to the first temperature and the second temperature, specifically comprises:
determining a rotor temperature change amount according to the first temperature and the second temperature; and
estimating the third temperature according to the second temperature and the rotor temperature change amount.

7. The method according to claim 1, wherein the method further comprises:
determining a heating power of the permanent magnet motor according to a loss and a heat dissipation power of the permanent magnet motor;
acquiring a heating power of a stator core and a heating power of a stator winding of the permanent magnet motor; and determining the power for heating the rotor according to the heating power of the permanent magnet motor, the heating power of the stator winding and the heating power of the stator core.

8. The method according to claim 7, wherein before determining the heating power of the permanent magnet motor according to the loss and the heat dissipation power of the permanent magnet motor, the method further comprises
calculating the loss of the permanent magnet motor according to a stator core loss, a stator winding loss and an eddy current loss of the rotor.

9. The method according to claim 7, wherein acquiring the heating power of the stator core and the heating power of the stator winding of the permanent magnet motor, specifically comprises
acquiring a temperature change amount of the stator core and a temperature change amount of the stator winding in the sampling time interval;
determining the heating power of the stator core according to the temperature change amount of the stator core, a mass of the stator core and a material specific heat capacity of the stator core; and
determining the heating power of the stator winding according to the temperature change amount of the stator winding, a mass of the stator winding and a material specific heat capacity of the stator winding.

10. The method according to claim 1, wherein the method further comprises:
determining an eddy current loss of the rotor according to a second formula, wherein the second formula is:

$$P_R = K_r f^2 B_s^2$$

wherein $P_R$ is the eddy current loss of the rotor, $K_r$ is an eddy current loss coefficient of the rotor, $B_s$ is a magnetic flux density amplitude of the rotor, and f denotes an electrification frequency of the stator winding.

11. A motor controller, comprising:
a memory, is configured to storing computer-executed instructions;
a processor, is configured to acquire a second temperature of a rotor according to system parameters and a first temperature of a rotor of a permanent magnet motor; wherein the system parameters comprise: a material specific heat capacity of the rotor, a mass of the rotor, and a power for heating the rotor in a sampling time interval, the first temperature is a temperature of the rotor at a first sampling time, the second temperature is a temperature of the rotor at a second sampling time, the second sampling time is a current sampling time, and the first sampling time is a previous sampling time of the second sampling time;
the processor is configured to estimate a third temperature of the rotor according to the first temperature and the second temperature, wherein the third temperature is a temperature of the rotor at a third sampling time, and the third sampling time is a next sampling time of the second sampling time; and
the processor is configured to stop self-heating of the traction battery when the third temperature reaches a demagnetization temperature of the rotor.

12. The motor controller according to claim 11, wherein the processor is configured to collect a cell temperature of a cell of the traction battery at the second sampling time; and the processor is further configured to stop the self-heating of the traction battery when the cell temperature reaches a specified temperature of the cell.

13. The motor controller according to claim 11, wherein the processor is specifically configured to:
determine a rotor temperature change amount in the sampling time interval according to the system parameters; and
determine the second temperature according to the first temperature and the rotor temperature change amount.

14. The motor controller according to claim 13, wherein the processor is specifically configured to:
determine the rotor temperature change amount according to a first formula, wherein the first formula is:

$$\Delta T_R = \frac{\Delta P_1 \cdot \Delta \tau}{C_R M_R}$$

wherein $\Delta T_R$ denotes the rotor temperature change amount, $\Delta \tau$ denotes the sampling time interval, $C_R$ denotes the material specific heat capacity of the rotor, $M_R$ denotes the mass of the rotor, and $\Delta P_1$ denotes the power for heating the rotor.

15. The motor controller according to claim 11, wherein the processor is specifically configured to:
determine the rotor temperature change amount according to the first temperature and the second temperature; and
estimate the third temperature according to the second temperature and the rotor temperature change amount.

16. The motor controller according to claim 11, wherein the processor is further configured to:
determine a heating power of the permanent magnet motor according to a loss and a heat dissipation power of the permanent magnet motor;
acquire a heating power of a stator core and a heating power of a stator winding of the permanent magnet motor; and
determine the power for heating the rotor according to the heating power of the permanent magnet motor, the heating power of the stator winding and the heating power of the stator core.

17. The motor controller according to claim 16, wherein the processor is further configured to:
calculate the loss of the permanent magnet motor according to a stator core loss, a stator winding loss and an eddy current loss of the rotor.

18. The motor controller according to claim 16, wherein the processor is specifically configured to:
acquire a temperature change amount of the stator core and a temperature change amount of the stator winding in the sampling time interval;
determine the heating power of the stator core according to the temperature change amount of the stator core, a mass of the stator core and a material specific heat capacity of the stator core; and
determine the heating power of the stator winding according to a temperature change amount of the stator winding, a mass of the stator winding and a material specific heat capacity of the stator winding.

19. The motor controller according to claim 11, wherein the processor is further configured to:
determine an eddy current loss of the rotor according to a second formula, wherein the second formula is:

$$P_R = K_r f^2 B_s^2$$

wherein $P_R$ is the eddy current loss of the rotor, $K_r$ is an eddy current loss coefficient of the rotor, $B_s$ is a magnetic flux density amplitude of the rotor, and f denotes an electrification frequency of the stator winding.

20. A power system, comprising: a permanent motor, a traction battery, an inverter, and the motor controller of claim 11.

\* \* \* \* \*